United States Patent
Roy

(10) Patent No.: US 11,205,680 B2
(45) Date of Patent: Dec. 21, 2021

(54) NON-VOLATILE RANDOM ACCESS MEMORY (NVRAM)

(71) Applicant: NXP USA, INC., Austin, TX (US)

(72) Inventor: Anirban Roy, Austin, TX (US)

(73) Assignee: NXP USA, INC., Austin, TX (US)

( * ) Notice: Subject to any disclaimer, the term of this patent is extended or adjusted under 35 U.S.C. 154(b) by 169 days.

(21) Appl. No.: 16/558,818

(22) Filed: Sep. 3, 2019

(65) Prior Publication Data
US 2021/0066392 A1 Mar. 4, 2021

(51) Int. Cl.
| | | |
|---|---|---|
| H01L 27/108 | (2006.01) | |
| H01L 21/8242 | (2006.01) | |
| H01L 21/20 | (2006.01) | |
| H01L 27/24 | (2006.01) | |
| H01L 27/22 | (2006.01) | |
| H01L 43/12 | (2006.01) | |
| H01L 43/02 | (2006.01) | |
| H01L 45/00 | (2006.01) | |
| H01L 21/768 | (2006.01) | |
| H01L 29/94 | (2006.01) | |

(Continued)

(52) U.S. Cl.
CPC ........ *H01L 27/24* (2013.01); *H01L 21/76877* (2013.01); *H01L 27/0629* (2013.01); *H01L 27/108* (2013.01); *H01L 27/10829* (2013.01); *H01L 27/222* (2013.01); *H01L 29/407* (2013.01); *H01L 29/945* (2013.01); *H01L 43/02* (2013.01); *H01L 43/12* (2013.01); *H01L 45/06* (2013.01); *H01L 45/16* (2013.01)

(58) Field of Classification Search
CPC ..... H01L 23/528; H01L 27/108; H01L 28/40; H01L 23/5226; H01L 27/24; H01L 27/222; H01L 43/02; H01L 43/12; H01L 45/06; H01L 45/16; H01L 21/76877; H01L 27/10829; H01L 27/10867; H01L 27/10861; H01L 27/0733; H01L 27/0629; H01L 29/945; H01L 29/407
See application file for complete search history.

(56) References Cited

U.S. PATENT DOCUMENTS

| | | |
|---|---|---|
| 5,196,722 A | 3/1993 | Bergendahl et al. |
| 5,617,349 A | 4/1997 | Koike |
| 5,640,030 A | 6/1997 | Kenney |

(Continued)

OTHER PUBLICATIONS

Abe., K., et al., "Novel Hybrid DRAM/MRAM Design for Reducing Power of High Performance Mobile CPU", 2012 IEEE International Electron Devices Meeting (IEDM), pp. 10.5.1-10.5.4.

(Continued)

*Primary Examiner* — Alonzo Chambliss

(57) ABSTRACT

A semiconductor device and methods for making the same are disclosed. The device may include: a first transistor structure; a second transistor structure; a capacitor structure comprising a trench in the substrate between the first and second transistor structures, the capacitor structure further comprising a doped layer over the substrate, a dielectric layer over the doped layer, and a conductive fill material over the dielectric layer; a first conductive contact from the first transistor structure to a first bit line; a second conductive contact from the second transistor to a non-volatile memory element; and a third conductive contact from the non-volatile memory element to a second bit line.

20 Claims, 3 Drawing Sheets

(51) Int. Cl.
*H01L 27/06* (2006.01)
*H01L 29/40* (2006.01)

(56) References Cited

U.S. PATENT DOCUMENTS

| | | | |
|---|---|---|---|
| 5,689,456 | A | 11/1997 | Kobayashi |
| 6,097,629 | A | 8/2000 | Dietrich et al. |
| 6,556,487 | B1 | 4/2003 | Ratnakumar |
| 7,054,194 | B2 | 5/2006 | Liaw et al. |
| 7,795,659 | B2 | 9/2010 | Yoon et al. |
| 7,944,734 | B2 | 5/2011 | Lamorey |
| 8,519,462 | B2 | 8/2013 | Wang et al. |
| 8,635,511 | B2 | 1/2014 | Takeuchi et al. |
| 9,607,663 | B2 | 3/2017 | Roy et al. |
| 2005/0017285 | A1 | 1/2005 | Tzeng et al. |
| 2005/0026359 | A1 | 2/2005 | Voigt et al. |
| 2006/0054955 | A1 | 3/2006 | Kim |
| 2009/0174031 | A1 | 7/2009 | Wang et al. |
| 2009/0230508 | A1* | 9/2009 | Dyer .................. H01L 21/3086 257/532 |
| 2010/0134047 | A1 | 6/2010 | Hasnain |
| 2010/0316399 | A1 | 12/2010 | Hanamoto et al. |
| 2011/0294291 | A1 | 12/2011 | Matsui et al. |
| 2013/0077382 | A1 | 3/2013 | Cho et al. |
| 2016/0093671 | A1 | 3/2016 | Roy |

OTHER PUBLICATIONS

Calderoni, et al., "Performance comparison of O-based and Cu-based ReRAM for high-density applications", IEEE 6th International Memory Workshop (IMW), May 18-21, 2014, pp. 5-8, Taipei.

Fackenthal, R., et al., "A 16Gb ReRAM with 200MB/s Write and 16B/s Read in 27nm Technology", 2014 IEEE International Solid-State Circuits Conference, San Francisco, CA, pp. 338-340.

Fukumoto, K., et al., "A 256K-Bit Non-Volatile PSRAM with Page Recall and Chip Store", 1991 Symposium on VLSI Circuits, Oiso, Japan, pp. 91-92.

Keeth, B., et al., "DRAM Circuit Design: Fundamental and High-Speed Topics", 2nd Edition, Dec. 2007, 440 pages (pp. 33-45 as relevant to this application).

Noguchi, et al., "D-RAM cache: Enhancing energy with 3T-1MTJ DRAM/MRAM hybrid memory", Design, Automation & Test in Europe Conference & Exhibition, Mar. 18-22, 2013, pp. 1813-1818, grenoble, France.

Tanaka, C., et al., "Normally-off type nonvolatile static random acess memory with perpendicular spin torque transfer-magnetic random access memory cells and smallest number of transistors", Japanese Journal of Applied Physics, vol. 53, No. 4S, published Mar. 18, 2014, 4 pages.

* cited by examiner

NON-VOLATILE RANDOM ACCESS MEMORY (NVRAM)

This application is a divisional application of a U.S. patent application entitled "NON-VOLATILE RANDOM ACCESS MEMORY (NVRAM)", having a serial number of Ser. No. 14/501,781, having a filing date of Sep. 30, 2014, having common inventors, and having a common assignee, all of which is incorporated by reference in its entirety.

BACKGROUND

Field

This disclosure relates generally to integrated circuits, and more particularly, to non-volatile random access memories (NVRAMs).

Related Art

Non-volatile memories (NVMs) have become very important in a variety of applications but NVMs typically are slower than other types of memories. Thus it is common to have both NVMs and random access memories (RAMs) on the same integrated circuit because normal operations typically do not require the non-volatile feature. One approach is to combine the non-volatile feature with RAM characteristics. For example, the non-volatile feature is used on rarely, such as at power-up and power-down, and the RAM characteristic is used otherwise. Thus, the same memory is accessed whether it is the RAM characteristic that is being utilized or the non-volatile characteristic. Arranging a memory that has both of these characteristics in a manner that is effective in achieving the desired operating characteristics without requiring excessive space has been found to be challenging.

Accordingly there is a need to provide further improvement in obtaining NVRAMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a non-volatile random access memory cell has a capacitor located between two transistors. One of the transistors is coupled to a volatile bit line and the other transistor is coupled to a non-volatile resistive element which in turn is coupled to a non-volatile bit line. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
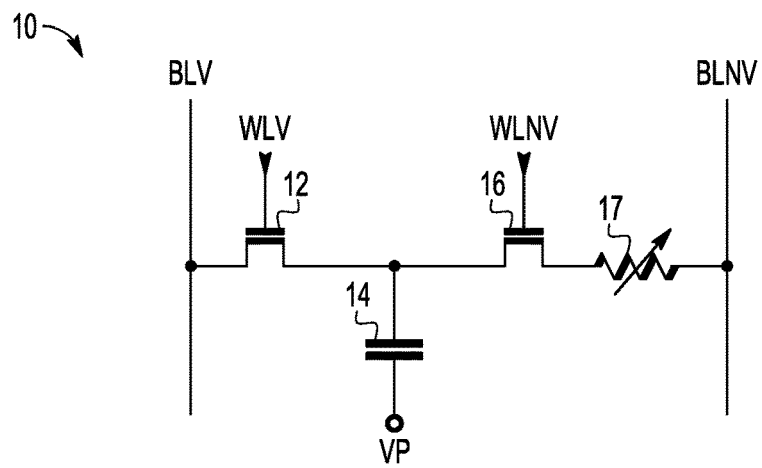
FIG. 1 is a circuit diagram of a non-volatile random access memory (NVRAM) cell.

Shown in FIG. 1 is non-volatile random access memory (NVRAM) cell 10 having an N channel transistor 12, a capacitor 14, an N channel transistor 16, a volatile bit line BLV, a non-volatile bit line BLNV, and a non-volatile (NV) element 17 that is in either a high resistive state or a low resistive state. Thus, NV element 17 is variable in its resistance but does not change resistance with a loss of power applied to the terminals. Transistor 12 has a first current electrode coupled to volatile bit line BLV, a control electrode coupled to a volatile word line WLV, and a second current electrode coupled to a first terminal of capacitor 14. Transistor 16 has a first current electrode coupled to a first terminal of NV element 17, a control electrode coupled to a NV word line WLNV, and a second current electrode coupled to the first terminal of capacitor 14 and to the second current electrode of transistor 12. Capacitor 14 has a second terminal coupled to a plate voltage VP. NV element 17 has a second terminal coupled to NV bit line BLNV. Some examples of NV element 17 include a resistive random access memory element, a magnetic random access memory element, a phase-change memory resistive element, and a carbon nanotube resistive element.

In operation, NV element 17 is programmed into either a high resistive state or a low resistive state and power is removed. When power is restored, NV element 17 retains its resistive state. Its resistive state is read by charging capacitor 14 to a predetermined voltage such as the power supply voltage, applying a pulse to word line WLNV that causes transistor 16 to become conductive for the duration of the pulse while NV bit line BLNV is held to ground. The voltage on capacitor 14 is then read by enabling transistor 12 which couples the voltage on capacitor 14 to be coupled to volatile bit line BLV. The voltage on volatile bit line BLV is then compared to a reference. If the voltage on volatile bit line BLV is above the reference, that means NV element 17 was in its high resistive state because there was a relatively small amount of charge discharged through transistor 16 and NV element 17 when the pulse was applied to the gate of transistor 16. On the other hand, if the voltage on volatile bit line BLV is below the reference that means NV element 17 was in its low resistive state because there a relatively high amount of charge discharged through transistor 16 and NV element 17 when the pulse was applied to the gate of transistor 16. During RAM operation, transistor 16 is held non-conductive by word line WLNV being at a sufficiently low voltage such as ground. For RAM operation, a write is achieved by applying either a logic low or a logic high voltage to volatile bit line BLV while transistor 12 is held conductive by volatile word line WLV applying a logic high. A read is achieved by precharging volatile bit line BLV to a predetermined voltage and causing transistor 12 to become conductive by applying a logic high from volatile word line WLV to the gate of transistor 12. The voltage on capacitor 14, whether at a relatively high voltage or low voltage, effects the voltage of volatile bit line BLV predictably so that it can be determined if the capacitor 14 is storing a logic high or a logic low. NV element 17, which is between transistor 16 and NV bit line BLNV instead of between transistors 12 and 16, is beneficial for layout efficiency because the connection of transistors 12 and 16 is very efficient for laying out NVMRAM cell 10.

Figure 2:
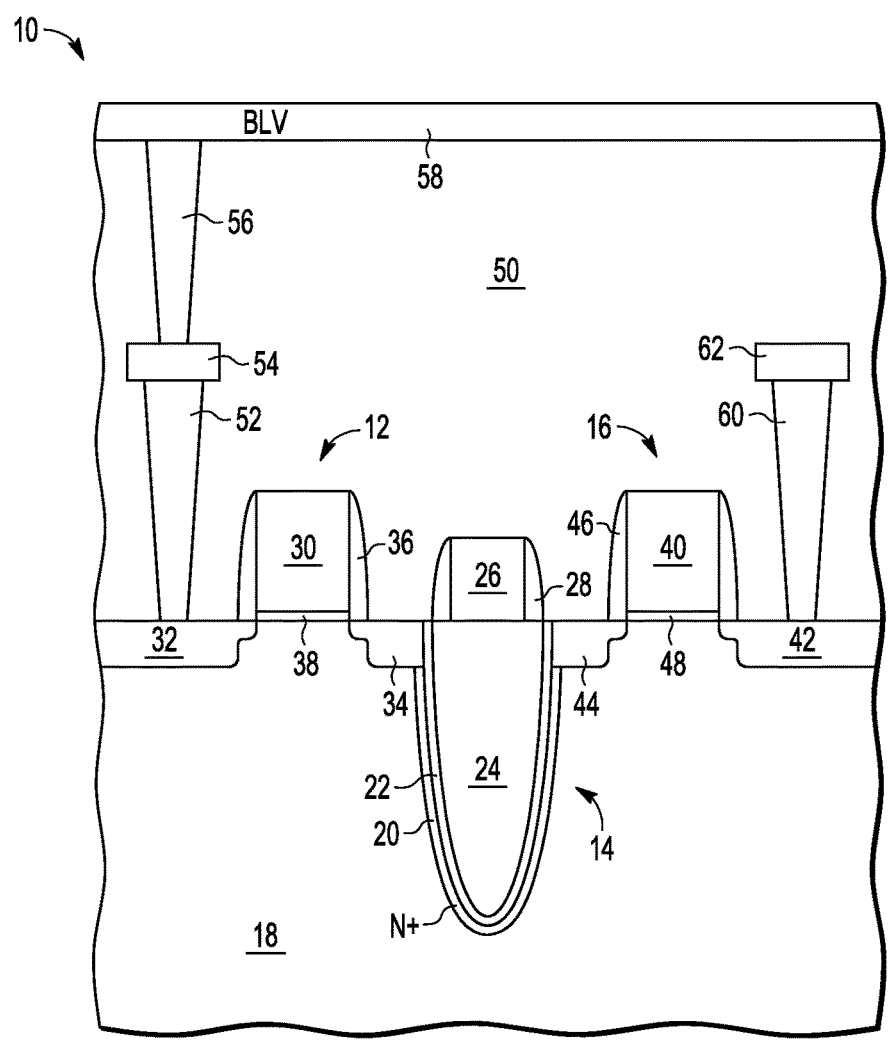
FIG. 2 is a first cross section of the NVRAM cell of FIG. 1.

Shown in FIG. 2 is a first cross section of NVRAM cell 10 showing the structure of transistors 12 and 16 and capacitor 14 utilizing a substrate 18 that may be doped to P type. Transistor 12 has a gate 30 that functions as the control electrode, a source/drain 32 that functions as the first current electrode, a source/drain 34 that functions as the second current electrode, a sidewall spacer 36 around gate 30, and a gate dielectric 38 between gate 30 and substrate 18. Transistor 16 has a gate 40 that functions as the control electrode, a source/drain 42 that functions as the first current electrode, a source/drain 44 that functions as the second current electrode, a sidewall spacer 46 around gate 40, and a gate dielectric 48 between gate 40 and substrate 18. Capacitor 14 has an opening, which may be referenced as a trench, in substrate 18 that has an outer liner 20 that is heavily doped to N type in the case of substrate 18 being P type, a dielectric liner 22 adjacent to heavily doped outer liner 20, and a conductive fill material 24 that fills the opening. Doped outer liner 20 may be referenced as a doped region. On and in electrical contact with conductive fill material 24 is a conductive cap structure 26 that is conductive and has a sidewall spacer 28 around it. Conductive cap structure 26 extends to other capacitors of other NVRAM cells not shown in FIG. 2. NVRAM cell 10 further includes a via 52, a portion 54 of a first metal layer, a via 56, volatile bit line BLV which is a portion 58 of a second metal layer, a via 60, and a portion 62 of the first metal layer. Via 52 contacts source/drain 32 at the top surface of substrate 18 on a bottom end of via 52 and portion 54 of the first metal layer on a top end of via 52. Via 56 contacts portion 54 of the first metal layer on a bottom end of via 56 and portion 58 of the second metal layer on a top end of via 56. Via 60 contacts source/drain region 42 on a bottom end of via 60 and a portion 62 of the first metal layer on a top end of via 60. An interlayer dielectric (ILD) 50 is formed over substrate 18 and around the various features between substrate 18 and portion 58 of the second metal layer. Capacitor 14 is connected to source/drains 34 and 44 by outer liner 20 which is of the same conductivity as source/drains 34 and 44. In dynamic random access memories (DRAMs), the structure of transistor 12 and capacitor 14 is well known. While the location of NV element 17 is convenient for reading it is also convenient for programming because desired currents and voltages can be conveniently applied along NV bit line BLNV and while cell selection is conveniently completed NV word line WLNV. Vias function as conductive contacts.

Figure 3:
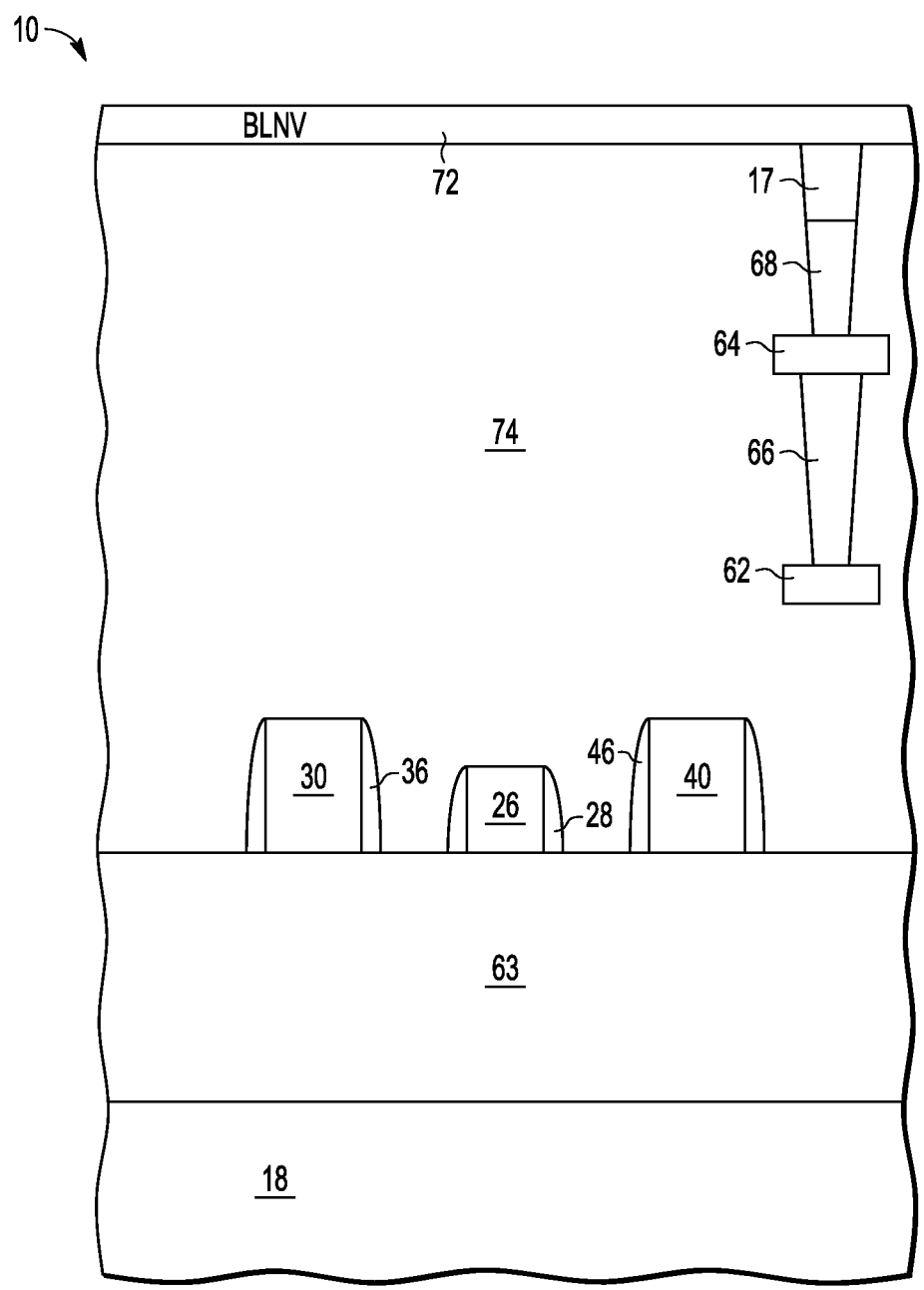
FIG. 3 is a second cross section of the NVRAM cell of FIG. 1.

Shown in FIG. 3 is a second cross section of NVRAM cell 10 showing, in addition to elements already shown, isolation region 63 in substrate 18, via 66, portion 64 of the second metal layer, a via 68, a portion 72 of a third metal layer, and ILD 74 which includes ILD 50 of FIG. 2. Gates 30 and 40 and conductive cap structure 26 are shown extending over isolation region 63 and extend along with volatile word line WLV and NV word line WLNV. Portion 62 extends from via 60 of FIG. 2 to via 66 and ends there as distinct from gates 30, 40, and conductive cap structure 26 which continue to extend to additional NVRAM cells. Via 66 contacts portion 62 of the first metal layer on a bottom end of via 66 and portion 64 of the second metal layer on a top end of via 66. Via 68 contacts portion 64 on a bottom end of via 68 and the first terminal of NV element 17 on a top end of via 68. The second terminal of NV element 17 contacts portion 72, which is NV bit line BLNV, of the third metal layer. As constructed there is a contact from source/drain 42 to NV element 17 and a contact from NV element 17 to NV bit line BLNV which is direct. This is a convenient location for NV element 17 but anywhere in the line from via 60 to via 68 could also be effective. Thus the contact from NV element 17 to NV bit line BLNV could also include one or more vias. Similar to ILD 50 of FIG. 2, ILD 74 is over substrate 18 and around the various features between substrate 18 and portion 72 of the third metal layer. Both ILD 50 and ILD 74 may be made of multiple dielectric layers.

Figure 4:
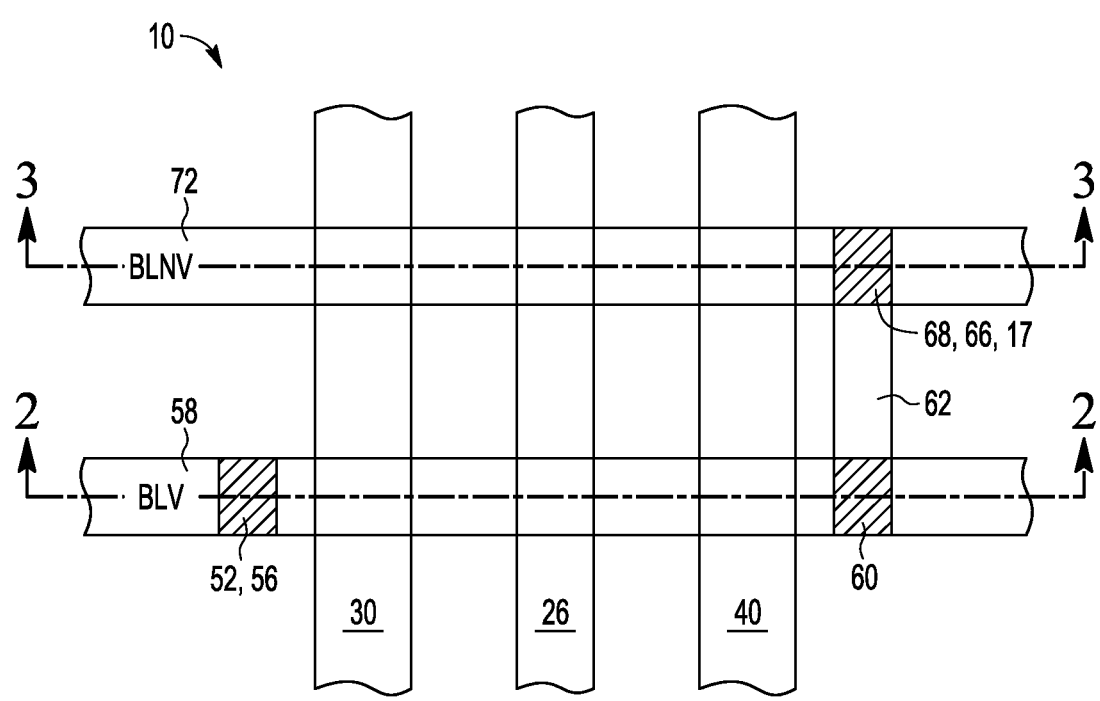
FIG. 4 is layout view depicting portions of the NVRAM cell of FIG. 1.

Shown in FIG. 4 is a top view of certain features of NVRAM cell 10 including portion 72 of the third metal layer that is volatile bit line BLV, portion 58 of the second metal layer that is NV bit line BLNV, gate 30, conductive cap structure 26, gate 40, portion 62 of the first metal layer, portion 62 of the first metal layer, the location (shown by cross hatching) of vias 52 and 56, the location (shown by cross hatching) of vias 66 and 68 and NV element 17, and the location (shown by cross hatching) of via 60. Vias 52 and 56 are under volatile bit line BLV and connect source/drain 32 to volatile bit line BLV. Via 60 is under volatile bit line BLV but does not connect to volatile bit line BLV but to portion 62 of the first metal layer which extends to be under NV bit line BLNV. Vias 66 and 68 extend from portion 62 of the first metal layer where it is under NV bit line BLNV toward NV bit line BLNV and connect to NV element 17. NV element 17 is connected to NV bit line BLNV. The cross section of FIG. 2 is taken at line 2-2 of FIG. 4. The cross section of FIG. 3 is taken at line 3-3 of FIG. 4.

Thus, it is shown that efficiency in layout can be achieved by moving the NV element away from the interior portion of the memory cell and providing an efficient connection of the transistors that perform the data transfer for the volatile and NV accesses.

By now it should be appreciated that there has been provided a method of making a semiconductor device including forming a first transistor structure over a substrate. The method further includes forming a second transistor structure over the substrate. The method further includes forming a capacitor structure as a trench in the substrate between the first and second transistor structures wherein the capacitor structure includes a doped layer over the substrate, a dielectric layer over the doped layer, and a conductive fill material over the dielectric layer. The method further includes forming a first conductive contact from the first transistor structure to a first bit line. The method further includes forming a second conductive contact from the second transistor to a non-volatile memory element. The method further includes forming a third conductive contact from the non-volatile memory element to a second bit line. The method may have a further characterization by which the doped layer is electrically coupled to a source/drain portion of the first transistor structure. The method may have a further characterization by which the doped layer is electrically coupled to a source/drain portion of the second transistor structure. The method may have a further characterization by which the capacitor structure further comprises a conductive cap structure over the conductive fill material. The method may have a further characterization by which the first conductive contact includes a first via electrically coupled to a source/drain region of the first transistor structure, a second via electrically coupled to the first bit line, and a first portion of a first metal layer electrically coupled to the first and second vies. The method may have a further characterization by which the second conductive contact includes a first via electrically coupled to a source/drain region of the second transistor structure, a second via, a second portion of the first metal layer electrically coupled to the first and second vias, a third via, and a portion of a second metal layer electrically coupled to the second and third vias. The method may have a further characterization by which the non-volatile memory element comprises a variable resistive element. The method may have a further characterization by which the variable resistive element comprises one of a group consisting of: a resistive random access memory element, a magnetic random access memory element, a phase-change memory resistive element, and a carbon nanotube resistive element.

Also disclosed is a method of making a semiconductor device including forming a first transistor structure over a substrate. The method further includes forming a second transistor structure over the substrate. The method further includes forming a capacitor structure in the substrate between the first and second transistor structures. The method further includes forming a first conductive contact from the first transistor structure to a first bit line. The method further includes forming a second conductive contact from the second transistor structure to a variable resistive element. The method further includes forming a third conductive contact from the variable resistive element to a second bit line. The method may have a further characterization by which the capacitor structure comprises a trench in the substrate, a doped layer over the substrate in which the doped layer electrically is coupled to a source/drain portion of the first transistor structure and to a source/drain portion of the second transistor structure, a dielectric layer over the doped layer, and a conductive fill material over the dielectric layer. The method may have a further characterization by which the capacitor structure further comprises a conductive cap structure over the conductive fill material. The method may have a further characterization by which the first conductive contact includes a first via electrically coupled to a source/drain region of the first transistor structure, a second via electrically coupled to the first bit line, and a first portion of a first metal layer electrically coupled to the first and second vias. The method may have a further characterization by which the second conductive contact includes a first via electrically coupled to a source/drain region of the second transistor structure, a second via, a second portion of the first metal layer electrically coupled to the first and second vias, a third via, and a portion of a second metal layer electrically coupled to the second and third vias. The method may have a further characterization by which the variable resistive element comprises one of a group consisting of: an resistive random access memory element, a magnetic random access memory element, a phase-change memory resistive element, and a carbon nanotube resistive element.

Disclosed also is a semiconductor device including a first transistor structure over a substrate. The semiconductor device further includes a second transistor structure over the substrate. The semiconductor device further includes a capacitor structure comprising a trench in the substrate between the first and second transistor structures in which the capacitor structure further includes a dielectric layer over the doped layer and a conductive fill material over the dielectric layer. The semiconductor device further includes a first conductive contact from the first transistor structure to a first bit line. The semiconductor device further includes a second conductive contact from the second transistor to a non-volatile memory element. The semiconductor device further includes a third conductive contact from the non-volatile memory element to a second bit line. The semiconductor device may have a further characterization by which the doped layer is electrically coupled to a source/drain portion of the first transistor structure and to a source/drain portion of the second transistor structure. The semiconductor device may have a further characterization by which the capacitor structure further comprises a conductive cap structure over the conductive fill material. The semiconductor device may have a further characterization by which the first conductive contact includes a first via electrically coupled to a source/drain region of the first transistor, a second via electrically coupled to the first bit line, and a first portion of a first metal layer electrically coupled to the first and second vias. The semiconductor device may have a further characterization by which the second conductive contact includes a first via electrically coupled to a source/drain region of the second transistor, a second via, a second portion of the first metal layer electrically coupled to the first and second vias, a third via, and a portion of a second metal layer electrically coupled to the second and third vias. The semiconductor device may have a further characterization by which the non-volatile memory element comprises a variable resistive element, the variable resistive element selected from one of a group consisting of: a resistive random access memory element, a magnetic random access memory element, a phase-change memory resistive element, and a carbon nanotube resistive element.

Although the invention is described herein with reference to specific embodiments, various modifications and changes can be made without departing from the scope of the present invention as set forth in the claims below. For example, the connection of the NV element is shown being directly connected to the NV bit line but other locations may also be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a first transistor structure over a substrate;
   a second transistor structure over the substrate;
   a capacitor structure comprising a trench in the substrate between the first and second transistor structures, the capacitor structure further comprising:
      a heavily doped layer lining the trench;
      a dielectric layer adjacent to the doped layer; and
      a conductive fill material on the dielectric layer;
   a first conductive contact from the first transistor structure to a first bit line;
   a second conductive contact from the second transistor to a non-volatile memory element; and
   a third conductive contact from the non-volatile memory element to a second bit line.

2. The semiconductor device of claim 1, wherein the doped layer is electrically coupled to a source/drain portion of the first transistor structure and to a source/drain portion of the second transistor structure.

3. The semiconductor device of claim 1, wherein the capacitor structure further comprises a conductive cap structure over the conductive fill material.

4. The semiconductor device of claim 1, wherein the first conductive contact comprises:
a first via electrically coupled to a source/drain region of the first transistor;
a second via electrically coupled to the first bit line; and
a first portion of a first metal layer electrically coupled to the first and second vias.

5. The semiconductor device of claim 4, wherein the second conductive contact comprises:
a third via electrically coupled to a source/drain region of the second transistor;
a fourth via;
a second portion of the first metal layer electrically coupled to the third and fourth vias;
a fifth via; and
a portion of a second metal layer electrically coupled to the fourth and fifth vias.

6. The semiconductor device of claim 1, wherein the non-volatile memory element comprises a variable resistive element, the variable resistive element selected from one of a group consisting of: a resistive random access memory element, a magnetic random access memory element, a phase-change memory resistive element, and a carbon nanotube resistive element.

7. A semiconductor device comprising:
a first transistor structure over a substrate;
a second transistor structure over the substrate;
a capacitor structure comprising a trench in the substrate between the first and second transistor structures, the capacitor structure further comprising:
a heavily doped liner in the trench, the heavily doped liner having the same conductivity type as that of a source/drain portion of the first transistor structure and of a source/drain portion of the second transistor structure, the heavily doped liner electrically coupled to and contiguous with a bottom-most surface of the source/drain of the first transistor structure and contiguous with a bottom-most surface of the source/drain of the second transistor structure;
a dielectric layer adjacent to the heavily doped liner and below the top surface of the substrate; and
a conductive fill material over the dielectric layer in the trench;
a first conductive contact from the first transistor structure to a first bit line;
a second conductive contact from the second transistor to a non-volatile memory element; and
a third conductive contact from the non-volatile memory element to a second bit line.

8. The semiconductor device of claim 7, wherein the non-volatile memory element is in series between the second transistor and the second bit line.

9. The semiconductor device of claim 7, wherein the capacitor structure further comprises a conductive cap structure over the conductive fill material.

10. The semiconductor device of claim 7, wherein the first conductive contact comprises:
a first via electrically coupled to a source/drain region of the first transistor structure;
a second via electrically coupled to the first bit line; and
a first portion of a first metal layer electrically coupled to the first and second vias.

11. The semiconductor device of claim 10, wherein the second conductive contact comprises:
a third via electrically coupled to a source/drain region of the second transistor structure;
a fourth via;
a second portion of the first metal layer electrically coupled to the third and fourth vias;
a fifth via; and
a portion of a second metal layer electrically coupled to the fourth and fifth vias.

12. The semiconductor device of claim 7, wherein the non-volatile memory element comprises a variable resistive element.

13. The semiconductor device of claim 12, wherein the variable resistive element comprises one of a group consisting of: a resistive random access memory element, a magnetic random access memory element, a phase-change memory resistive element, and a carbon nanotube resistive element.

14. A semiconductor device comprising:
a first transistor structure over a substrate;
a second transistor structure over the substrate;
a capacitor structure comprising a trench in the substrate between the first and second transistor structures, the capacitor structure further comprising a first plate of the capacitor structure comprising a heavily doped liner in the trench and below a top surface of the substrate, the heavily doped liner having a same conductivity type as that of a source/drain portion of the first transistor structure and of a source/drain portion of the second transistor structure, the heavily doped liner electrically coupled to and contiguous with a bottom-most surface of the source/drain portion of the first transistor structure and coupled to and contiguous with a bottom-most surface of the source/drain portion of the second transistor structure;
a first conductive contact from the first transistor structure to a first bit line;
a second conductive contact from the second transistor structure to a first terminal of a variable resistive element; and
a third conductive contact from a second terminal of the variable resistive element to a second bit line used to access the variable resistive element.

15. The semiconductor device of claim 14, wherein the variable resistive element is in series between the second transistor and the second bit line.

16. The semiconductor device of claim 14, wherein the capacitor structure further comprises a dielectric layer over an inner surface of the heavily doped layer and a conductive fill material over an inner surface of the dielectric layer forming a second plate of the capacitor structure.

17. The semiconductor device of claim 16, wherein the capacitor structure further comprises a conductive cap structure over the conductive fill material.

18. The semiconductor device of claim 14, wherein the first conductive contact comprises:
a first via electrically coupled to a source/drain region of the first transistor structure;
a second via electrically coupled to the first bit line; and
a first portion of a first metal layer electrically coupled to the first and second vias.

19. The semiconductor device of claim 18, wherein the second conductive contact comprises:
a third via electrically coupled to a source/drain region of the second transistor structure;
a fourth via;

a second portion of the first metal layer electrically coupled to the third and fourth vias;
a fifth via; and
a portion of a second metal layer electrically coupled to the fourth and fifth vias.

20. The semiconductor device of claim 14, wherein the variable resistive element comprises one of a group consisting of: a resistive random access memory element, a magnetic random access memory element, a phase-change memory resistive element, and a carbon nanotube resistive element.

\* \* \* \* \*